United States Patent
Pilch, Jr. et al.

[11] Patent Number: 5,706,234
[45] Date of Patent: Jan. 6, 1998

[54] TESTING AND REPAIR OF WIDE I/O SEMICONDUCTOR MEMORY DEVICES DESIGNED FOR TESTING

[75] Inventors: Charles J. Pilch, Jr.; Carl W. Perrin, both of Sugar Land; Duy-Loan T. Le, Missouri City; Scott E. Smith, Sugar Land, all of Tex.; Yutaka Komai, Tsuchiuraq, Japan

[73] Assignee: Texas Instruments Incorporated, Dallas, Tex.

[21] Appl. No.: 766,705

[22] Filed: Dec. 13, 1996

Related U.S. Application Data

[63] Continuation of Ser. No. 540,330, Oct. 6, 1995, abandoned, which is a continuation of Ser. No. 236,596, Apr. 29, 1994, abandoned.

[51] Int. Cl.$^6$ .................................................. G01R 31/28
[52] U.S. Cl. ............... 365/201; 365/230.03; 365/189.01; 371/21.1
[58] Field of Search ............... 365/201, 189.01, 365/189.07, 230.03, 200; 371/21.1, 21.2, 21.3

[56] References Cited

U.S. PATENT DOCUMENTS

| | | | |
|---|---|---|---|
| 5,075,892 | 12/1991 | Choy | 371/21.2 |
| 5,117,426 | 5/1992 | McAdams | 371/214 |
| 5,208,776 | 5/1993 | Nasu et al. | 365/200 |
| 5,228,000 | 7/1993 | Yamagata | 365/201 |
| 5,265,100 | 11/1993 | McClure et al. | 371/21.2 |
| 5,295,101 | 3/1994 | Stephens, Jr. et al. | 365/200 |
| 5,327,380 | 7/1994 | Kersh, III et al. | 365/195 |
| 5,383,157 | 1/1995 | Phelan | 365/201 |
| 5,394,369 | 2/1995 | Kagami | 365/201 |
| 5,400,281 | 3/1995 | Morigami | 365/201 |

*Primary Examiner*—David C. Nelms
*Assistant Examiner*—Vu A. Le
*Attorney, Agent, or Firm*—Robert N. Rountree; Leo N. Heiting; Richard L. Donaldson

[57] ABSTRACT

A semiconductor memory device 40 includes an array of storage cells 130, addressable by row and column and specifically designed for testing. Row and column addresses are decoded to access a row and plural columns simultaneously. A test data bit to be written into the storage cells is replicated and stored into as many storage cells at once as there are columns simultaneously accessed. Upon readout for a comparison test, plural occurrences of the stored test data bit are compared with each other and with an expected data bit within parallel comparator circuitry 140 located within the memory device. A pass/fail signal (on lead 170) from the parallel comparator circuitry is transmitted to the memory device tester 30 for final defect analysis and correction. When a failure/defect is detected, information representing the address and the type of failure are stored in the memory device tester. A memory device test method also is described.

35 Claims, 2 Drawing Sheets

TESTING AND REPAIR OF WIDE I/O SEMICONDUCTOR MEMORY DEVICES DESIGNED FOR TESTING

This application is a continuation of application Ser. No. 08/540,330, filed Oct. 6, 1995 abandoned which is a continuation of application Ser. No. 08/236,596, filed on Apr. 29, 1994, now abandoned.

FIELD OF THE INVENTION

This invention relates to testing semiconductor memory devices and more particularly to semiconductor memory devices designed for testing and a method for testing such devices.

BACKGROUND OF THE INVENTION

Semiconductor memory devices store information in arrays of cells arranged in addressable rows and columns. During fabrication of these devices, one or more defects may occur and prevent the proper performance of the memory circuit. If a systematic defect occurs, in many cases it can be causally analyzed and designed out. Other defects, such as short circuits between adjacent columns and open circuits within individual columns of memory cells, also occur. For analysis purposes, the distribution of such other defects in a memory device, as well as the distribution of the number of such defects among a given production lot, may be considered random. The yield of good devices in a lot can be modelled according to a Poisson distribution function. Typically, over the period of time that a particular device is being produced in a given manufacturing facility, device yield can be improved by eliminating the cause of such other defects, e.g., extraneous particulate matter.

Generally, it is desirable to further improve the yield of memory devices by replacing bad rows and columns with redundant rows and columns. For instance, during testing of the chip, defective columns of memory cells can be identified and replaced. Redundancy replacement techniques are especially suited for semiconductor memories because these devices comprise large numbers of replicated storage elements arranged in rows and columns. This array format lends itself to replacement of a defective portion with an identical redundant portion.

A useful redundancy scheme may be implemented by substituting, for a defective column or a defective row, one of a plurality of universal decode circuits that will select one of the redundant columns or redundant rows rather than the defective column or row. Appropriate fuses are included in the scheme to be opened both to activate the selected redundant column or row and to program the decoder circuits to respond appropriately to applied addresses. Address integrity is maintained by substituting the redundant column or row circuit to respond to the address of the replaced column or row. Thus the address of each defective column or row is reassigned to the redundant circuit.

A test and analysis system provides information for effecting repair of a semiconductor memory device. The test system includes a prober which houses a semiconductor wafer to be tested and provides an electrical interface between the test system and the several individual devices under test on the wafer. Typically the prober is preprogrammed to step through tests of one device after another until the test system sequentially acquires desired test data from all of the memory devices on the wafer. An exemplary prober, model EG 2010, is manufactured by Electroglass, Inc.

The test and analysis system includes a tester subsystem which interfaces directly with the prober and an analysis subsystem that outputs analysis information to either a storage device, a minicomputer or a repair station. The analysis system may include interfacing hardware for transferring repair scheme data to the minicomputer.

Semiconductor memory devices of all types are being made with progressively higher bit densities, smaller cell sizes, and more I/O pins, as the density of integrated memory circuits increases. During the late 1980's, 4 megabit memory devices were being designed and produced. During the 1990's 16 megabit memory devices are being produced. Memory device densities of 64 megabits and 256 megabits are expected to be produced during the 1990's. With increased memory device capacity, there must be improvement in some performance parameters such as memory access time.

Now, as memory devices become more and more dense, feature sizes become smaller and smaller. As a result the memory devices are susceptible to defects caused by particles which previously were too small to cause problems in the fabrication process. Thus with further increases in density there is a greater challenge to increase the number of random-type defects that can be repaired with redundancy schemes.

A problem with greater density memory devices is the increased amount of time required for testing and identifying replacement schemes to repair devices with some defects. Since the defects are random, each integrated circuit must be analyzed to identify an individual repair scheme. Total test time for a one megabit memory device is approximately seven seconds. The test time for a wafer of one megabit memory devices can easily exceed 30 minutes. The number of memory devices per wafer is expected to vary little as density of the devices increases because the wafer size also will increase. However, as density increases, test time per memory device increases because test time per storage cell is constant and each memory device includes a greater number of storage cells. Because the test time per memory device increases and the number of memory devices per wafer is relatively constant, the test time per wafer increases. Total time for testing and developing a replacement scheme for all of the 16 megabit memory devices on a wafer is expected to exceed seven hours unless some changes are made.

Another problem is that technicians who test memory devices desire to test the devices in parallel on a single device tester to make the most effective use of the device tester while end users of memory devices desire to use more and more wide I/O memory devices. Such wide I/O memory devices inherently limit the number of such devices which can be tested at once in parallel by a single device tester. Thus fewer of those devices can be tested simultaneously on one device tester. The problem is to find a way to test more wide I/O memory devices simultaneously on a single device tester.

SUMMARY OF THE INVENTION

These and other problems are solved by a test method and a semiconductor memory device including an array of storage cells addressable by row and column and specifically designed for testing. Row and column addresses are decoded to access a row and plural columns simultaneously. A test data bit, to be written into the storage cells, is replicated and stored into as many storage cells at once as there are columns simultaneously accessed. Upon readout for a comparison test, the plural occurrences of the stored test data bit are compared with each other and with an expected data bit within a parallel comparator circuitry located within the memory device. A pass/fail signal from the parallel comparator circuitry is transmitted to the memory device tester for final defect analysis and correction. When a failure/defect is detected, pass/fail information representing the address and the type of failure are stored in the memory device tester.

The parallel comparator circuitry is used advantageously in combination with the architecture of the memory device to reduce the number of I/O leads that need to be checked by the memory device tester. This allows more memory devices to be tested concurrently and thereby to increase the capacity of the memory device tester while it is testing wide I/O memory devices.

BRIEF DESCRIPTION OF THE DRAWINGS

The invention may best be understood by following detailed description when read with reference to the drawing wherein.

DETAILED DESCRIPTION OF THE INVENTION

Figure 1:
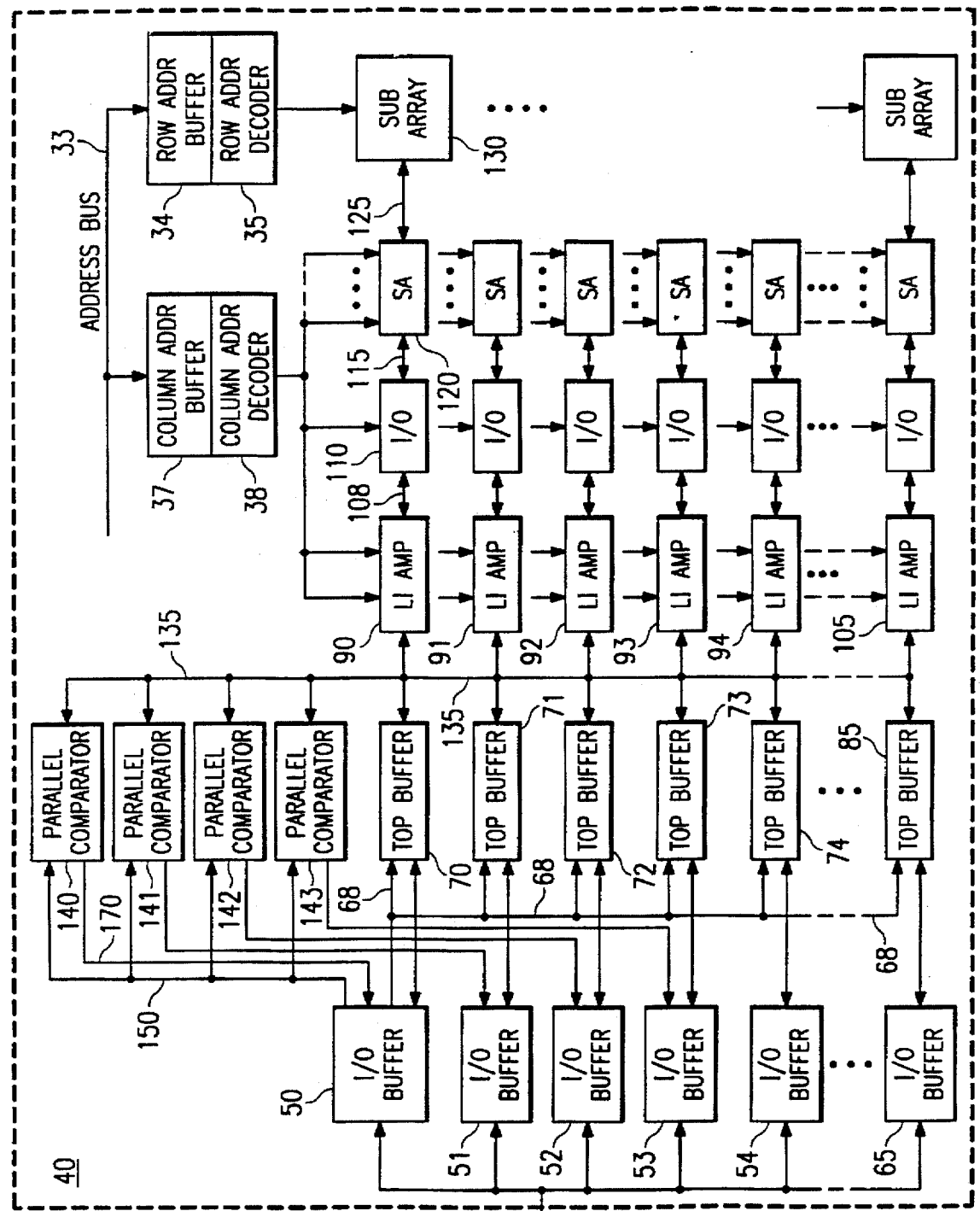
FIG. 1 is a block diagram of a memory device tester and a part of a memory device under test.

Referring to FIG. 1, a memory device tester 30 includes a microprocessor controller which reads a test program out of a memory to preset a series of address counters and input and output voltage levels for address drivers and data drivers. The controller also loads a program stored from the device tester memory into a pattern generator. The pattern generator controls the generation of a sequence of addresses by the address counters and of the test data bits to be transmitted through a prober and written into the memory device under test 40. The pattern generator thereafter generates addresses, expected data bits, and read signals to read stored test data bits from the memory device under test 40 to provide comparator circuitry within the memory device with the read out test data bits and the expected data bits, generated by the memory device tester 30. Based on differences between the data read from the memory device under test and the expected data bits, the parallel comparator circuitry makes a pass-fail decision to determine if any of the device under test memory cells are defective. A pass/fail signal and associated address information are forwarded to the device tester 30 for further analysis and device repair.

A procedure, or process, is used for testing a device and for determining a repair scheme that designates certain defective lines for replacement by redundant lines. This procedure includes the following. Enabling a test mode of the device under test 40. Performing DC electrical tests on the device under test to verify proper electrical contact and device operating characteristics. Systematically addressing the memory cells of the device and storing a pattern of test data bits into the memory cells of the device under test. Systematically addressing the memory cells and reading the stored test data bits from memory cells of the device under test. Comparing the data bits read from the device under test with one another and with the expected data bits, generated by the memory device tester, to identify defective cells. Storing cell address and test result information in the device tester 30.

The memory device tester 30 is used to test concurrently and to develop repair schemes for a group of high density memory devices. The total test time for a single wafer containing over 300 memory devices is approximately seven minutes. Similar tests, performed with a prior art system, typically require 45 minutes or longer.

Redundancy information can be gathered in great detail by the memory device tester 30 and subsequently used to determine defect types. This off-line device test method provides an efficient means to collect defect and redundancy data while providing the capability for testing memory devices with greater device densities during reasonably short time periods per memory device.

To start a test procedure, a test mode enabling signal is sent from the memory device tester 30 to all of the memory devices under test. An exemplary one of those devices under test is the memory device 40. During the test procedure, the memory device tester 30 sends row and column addresses, as needed, over an address bus 33 to the memory device 40 and other memory devices of a group of memory devices to be tested concurrently. The other memory devices are not shown specifically. Address bus connections to the other memory devices are represented by dashed lines extending from the address bus 33. Likewise control signals are sent simultaneously over a control bus 42 to the memory device 40 and to the other memory devices. Control bus connections to the other memory devices are represented by dashed lines extending from the control bus 42.

For the memory device tester 30, there is a fixed number of data input/output terminals for sending test data to the group of memory devices under test and for receiving resultant pass/fail signals back from the group of memory devices under test. As an example for this description, the memory device tester 30 includes sixteen data input/output terminals. When the memory device tester 30 is connected with memory devices for testing, a different group of four data leads is used for connecting the data input/output terminals of the memory device tester 30 with data input/output terminals of each of four memory devices. A data bus 45 is shown interconnecting the data input/output terminals of the memory device tester 30 with the data input/output terminals of the memory device 40. One group of the four groups of four data leads is connected to the memory device 40. The other three groups of four data leads are shown, as dashed lines extending from the data bus 45, to represent the connections to three other memory devices which are not shown.

Within the memory device 40, there are four separate input/output data terminals, each connected to one lead of the group of four data leads, associated with the memory device 40. Each of the four input/output data terminals is connected directly with one of four input/output buffers 50, 51, 52, 53. For a test operation, one test data bit is sent by the memory device tester 30 over one of the four data leads and is stored temporarily in the input/output buffer 50.

When the memory device tester 30 puts the device under test into the test mode, a series of addresses are applied by way of the address bus 33 to the device under test. First of all, a row address is applied to a row address buffer 34 and decoder 35 of the device under test to be decoded for accessing a whole row of memory cells in each sub array of the device. Then a column address is applied to the device under test. In the test mode, the column address is applied to a column address buffer 37 and decoder 38 where it is partially decoded so that the applied column address accesses a group of four columns of memory cells at once. Decoding of the column address is distributed across various parts of the device, as described hereinafter. Thus a selected group of four of the memory cells of the selected row in each quadrant of the memory device is accessed for storing the test data bit.

For a test write-in operation, the single test data bit, stored in the input/output buffer 50, is applied through a lead 68 with multiple connections for replicating the test data bit to sixteen top buffer circuits 70–85. From the top buffer circuits 70–85, the test data bit is applied to the inputs of sixteen groups of four line amplifiers 90–105 each. Each group of four line amplifiers receives the same test data bit, but only one of the four line amplifiers in the group is enabled at a time. Two column address bits are decoded for selecting which one of the four line amplifiers is enabled in each of the groups of line amplifiers. This is one part of the distribution of the column address decoding.

An amplified version of the single test data bit is applied from each of the enabled line amplifiers, e.g., one line amplifier in the group of line amplifiers 90, through a lead 108 to the inputs of a pair of local input/output buffers 110. There are one hundred twenty-eight of the local input/output buffers. Only sixteen are selected to be enabled at once. A single address bit is used to determine which of the pair of local input/output buffers is enabled for the output of each line amplifier. This is a second part of the distributed column address decoding.

The single test data bit then passes through a local input/output line 115 to a bank of sense amplifiers 120. In each bank, there are five hundred-twelve sense amplifiers. As a third part of the distributed column address decoding, nine bits of the address are decoded to enable one of the sense amplifiers in each of the banks. The enabled sense amplifier in the bank of sense amplifiers 120 enhances the test data bit and forwards it through bit lines 125 to one group of selected storage cells in a sub-array 130.

Thus the single test data bit from the device tester 30 is applied over a single lead of the data bus 45 and is replicated, by way of multiple connections of the lead 68, to sixteen sub-arrays of storage cells. There is a group of four columns of storage cells to which the test data bit is applied in each of four quadrants of the storage cells of the memory device 40. The test data bit is stored in the selected group of four storage cells in each of the four quadrants. Thus the single test data bit is replicated and is stored simultaneously into sixteen memory cells in each of the memory devices under test.

When the test data bit is stored in the selected group of memory cells, it may be stored in each memory cell without an error or else an error may be introduced into the test data bit stored in any selected memory cell because of some defect in the memory device.

Once a pattern of all desired test data bits is written from the device tester 30 into the appropriately selected cells of the test memory devices, as stored test data bits, the test procedure can be continued by reading the stored test data bits out of the test memory devices. The test mode enabling signal either is continued to be applied or else it is reapplied by the memory device tester 30 to the memory devices under test.

For a test readout operation, a row address, a column address, and a read memory signal are applied by the device tester 30 to the test memory devices. Once again the row address is buffered and decoded to select a row. Then the column address is buffered and partially decoded to select a column. Thus the stored test data bit from a selected storage cell in each memory device sub-array is read out of the selected storage cell and is transmitted along bit lines to the appropriately enabled sense amplifier, e.g., the selected sense amplifier in the block of sense amplifiers 120. The stored test data bit is enhanced by the selected sense amplifier and is forwarded through the associated input/output buffer 110 and a selected line amplifier in the group of line amplifiers 90 to a single lead of a bus 135 and a parallel comparator circuit 140. Four leads of the bus 135 are connected to the parallel comparator circuit 140. One lead is from each of the line amplifiers 90, 91, 92 and 93 so that four of the stored test data bits read out from the sub-arrays of the memory device 40 are applied in parallel to the inputs of the parallel comparator circuit 140.

The parallel comparator circuit 140 receives two stored test data bits from each of four of the line amplifiers 90, 91, 92 and 93. Each data bit in this group of stored test data bits is considered to have a positional notation number between 0 and 7. A purpose of the parallel comparator 140 is to determine whether or not all of the odd position numbered data bits have the same binary state and all of the even position numbered data bits have the same state. If the stored test data bits are not all alike, then an error exists among the read out stored test data bits and the parallel comparator circuit 140 produces a fail signal to be sent to the memory device tester 30 of FIG. 1. If the read out stored test data bits are all alike, then their state is compared with the state of an expected data bit EXD of the address being accessed for the stored test data bits. This expected data bit EXD is generated by the device tester 30 and is transmitted through the data bus 45, the I/O buffer 50, and a lead 150 to the parallel comparator 140. If all of the stored test data bits and the expected data bit are alike, the parallel comparator circuit 140 produces a pass signal to be sent to the memory device tester.

Figure 2:
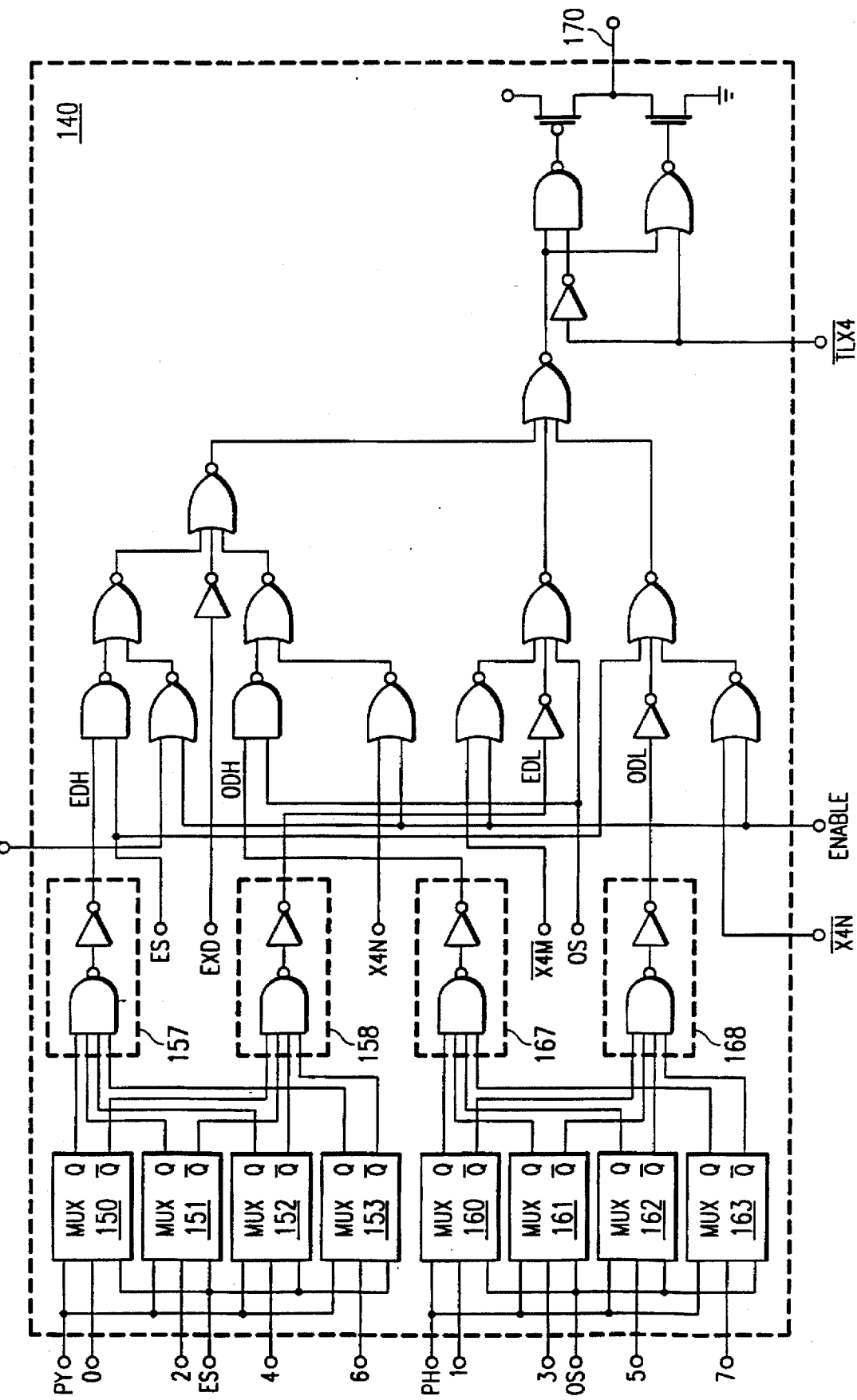
FIG. 2 is a schematic diagram of a parallel comparator circuit used in FIG. 1.

Referring now to FIG. 2, there is shown a schematic diagram of the parallel comparator circuit 140 for performing parallel comparison tests on the stored test data bits read out from the storage cells of the memory device 40. In the circuit of FIG. 2, each of the tests is enabled alternatively by even and odd select signals ES and OS. The even select signal ES enables a parallel comparison of the stored test data bits in the even numbered positions 0, 2, 4 and 6. For the even positions stored test data bits, four multiplexers 150–153 pass the selected stored test data bits to a pair of AND gates 157 and 158. The odd select signal OS enables a parallel comparison among the stored test data bits in the odd numbered positions 1, 3, 5 and 7. For the odd numbered positions stored test data bits, four multiplexers 160–163 pass the selected stored test data bits to a pair of AND gates 167 and 168.

When the even select signal ES is active and all of the read out stored test data bits in the positions 0–7 are high, an even data high signal EDH is a one and an even data low signal EDL is a zero. This state of these two even data signals indicates that all even positions data bits are ones. If the even select signal ES is active and all of the read out stored test data bits in the positions 0–7 are low, the even data high signal EDH is a zero and the even data low signal EDL is a one. This state of these two even data signals indicates that all even positions data bits are zeros. If the even select signal ES is active and the read out stored test data bits 0, 2, 4 and 6 include at least a one and a zero, both of the even data high and low signals EDH and EDL are ones. This state of these two even data signals indicates that an error exists among the even positions stored test data bits.

Similar input combinations, for the read out stored test data bit positions 1, 3, 5 and 7 when the odd select signal OS is active, produce similar resulting states of an odd data high signal ODH and an odd data low signal ODL. These signal states indicate, respectively, that all odd positions stored test data bits are ones, that all odd positions stored test data bits are zeros, and that an error exists among the odd positions stored test data bits.

The results of the parallel data test, i.e., the even data high and low signals EDH and EDL together with the odd data high and low signals ODH AND ODL, are then compared with the expected data bit EXD. This circuit of FIG. 2 compares the four outputs of the parallel data test, for a single quadrant of the memory device 40, with the single expected data bit EXD. The results of both parallel data comparisons, i.e., even and odd sets of stored test data bits, are compared with the expected data bit EXD. If all of the stored test data bits are alike and are equal to the expected data bit EXD, the parallel comparator 140 output signal on lead 170 is a pass signal, i.e., a signal having the same state as the expected data bit EXD. If there is any mismatch among any of the stored test data bits and the expected data bit EXD, the parallel comparator 140 output signal on the lead 170 is a fail signal, i.e., a signal state that is the complement of the state of the expected data bit EXD.

The sub-arrays, shown in FIG. 1, are paired with the I/O buffers such that data from each I/O buffer is stored in a separate one of the sub-arrays and the result of a comparison of test data read from that sub-array is carried through the same I/O buffer back to the device tester. Information relating to a repair address is available by checking fewer I/O locations than heretofore required. The reduction of I/O leads for testing is possible because the comparison test of plural stored test data bits is accomplished by the comparison circuitry included within the memory device.

Referring once again to FIG. 1, whatever output signal is generated on the lead 170 by the parallel comparator 140, it is forwarded through the input/output buffer 50 and a single lead of the data bus 45 to the memory device tester 30. Within the memory device tester 30, the pass/fail signal from the parallel comparator 140 is stored together with the expected data bit EXD and the accessed address for subsequent failure location analysis and repair of defective circuitry by replacing it with redundant circuitry.

The foregoing describes an embodiment of a memory device designed for test and a method for performing a test procedure on the memory device. The described embodiment and the described test method, together with others made obvious in view thereof, are considered to be within the scope of the appended claims.

What is claimed is:

1. A memory device comprising:
   an array of memory cells arranged in rows and columns;
   a row decoder circuit for selecting a first row of memory cells in the array, responsive to a first address;
   a column decoder circuit for selecting a first and a second column of memory cells in the array, responsive to a second address and a first logic state of a test mode signal, the column decoder circuit for selecting the first and not the second column of memory cells, responsive to the second address and a second logic state of the test mode signal, and the column decoder circuit for replacing the first and second columns of memory cells, responsive to the second address, if either column of memory cells is defective;
   a data terminal of the memory device for receiving a data bit; and
   a replicating circuit coupled to the data terminal, responsive to the test mode signal and a write signal, for replicating the data bit into a group of data bits and coupling the group of data bits to selected memory cells in the first and second columns of memory cells of the array.

2. A memory device, in accordance with claim 1, further comprising:
   a first sub-array of memory cells in the array of memory cells including the first row of memory cells; and
   a second sub-array of memory cells in the array of memory cells, separate from the first sub-array of memory cells, the second sub-array of memory cells including a second row of memory cells,
   wherein the row decoder circuit further selects the second row of memory cells, responsive to the first address and the first logic state of the test mode signal, the row decoder circuit replacing the first and second rows of memory cells, responsive to the first address, if either the first or second row of memory cells is defective.

3. A memory device, in accordance with claim 2, wherein the first address is a row address and the second address is a column address.

4. A memory device, in accordance with claim 2, wherein the first column of memory cells is in the first sub-array of memory cells and the second column of memory cells is in the second sub-array of memory cells.

5. A memory device, in accordance with claim 4, wherein the first address comprises a row address and the second address comprises a column address.

6. A memory device, in accordance with claim 2, further comprising plural sets of sub-arrays of memory cells, one of the sets having the first sub-array of memory cells and the second sub-array of memory cells.

7. A memory device, in accordance with claim 6, wherein the first sub-array includes the first column of memory cells, and the second sub-array includes the second column of memory cells.

8. A memory device, in accordance with claim 2, further comprising plural sets of sub-arrays of memory cells, one of the sets having the first sub-array of memory cells and another of the sets having the second sub-array of memory cells.

9. A memory device, in accordance with claim 8, wherein the first sub-array includes the first and the second columns of memory cells.

10. A memory device, in accordance with claim 2, wherein the row decoder circuit comprises plural row decoder circuits and at least one redundant row decoder circuit.

11. A memory device, in accordance with claim 10, wherein the column decoder circuit comprises plural column decoder circuits and at least one redundant column decoder circuit.

12. A memory device, in accordance with claim 11, further comprising a first group of data terminals and a second group of data terminals, wherein only the first group of data terminals is active, responsive to the first logic state of the test mode signal, and the first and second groups of data terminals are active, responsive to the second logic state of the test mode signal.

13. A memory device comprising:
   an array of memory cells arranged in rows and columns;
   a row decoder circuit for selecting a first row of memory cells in the array, responsive to a first address;
   a column decoder circuit for selecting a first and a second column of memory cells in the array, responsive to a second address and a first logic state of a test mode signal, the column decoder circuit for selecting the first and not the second column of memory cells, responsive to the second address and a second logic state of a test mode signal, and the column decoder circuit for replacing the first and second columns of memory cells, responsive to the second address, if either column of memory cells is defective;

a comparison circuit, responsive to the first logic state of the test mode signal and a read signal, for comparing a data bit from the first column of memory cells with another data bit from the second column of memory cells and producing a comparison signal indicating the result of the comparison; and a data terminal of the device for receiving the comparison signal.

14. A memory device, in accordance with claim 13, wherein the comparison signal is equivalent to the data bits if the data bits are the same, and the comparison signal is not equivalent to the data bits if the data bits are not the same.

15. A memory device, in accordance with claim 14, further comprising:

a latch circuit for storing a test data bit, wherein the comparison circuit further compares the data bits from the selected memory cells with the test data bit for producing the comparison signal.

16. A memory device, in accordance with claim 13, further comprising:

a first sub-array of memory cells in the array of memory cells including the first row of memory cells;

a second sub-array of memory cells in the array of memory cells, separate from the first sub-array of memory cells, the second sub-array of memory cells including a second row of memory cells, wherein the row decoder circuit further selects the second row of memory cells, responsive to the first address and the first logic state of the test mode signal, the row decoder circuit replacing the first and second rows of memory cells, responsive to the first address, if either the first or second row of memory cells is defective.

17. A memory device, in accordance with claim 16, wherein the first address is a row address and the second address is a column address.

18. A memory device, in accordance with claim 16, further comprising plural sets of sub-arrays of memory cells, one of the sets having the first sub-array of memory cells and the second sub-array of memory cells.

19. A memory device, in accordance with claim 18, wherein the first column of memory cells is in the first sub-array of memory cells, and the second column of memory cells is in the second sub-array of memory cells.

20. A memory device, in accordance with claim 16, further comprising plural sets of sub-arrays of memory cells, one of the sets having the first sub-array of memory cells and another of the sets having the second sub-array of memory cells.

21. A memory device, in accordance with claim 20, wherein the first sub-array includes the first and the second columns of memory cells.

22. A memory device, in accordance with claim 16, wherein the row decoder circuit comprises plural row decoder circuits and at least one redundant row decoder circuit.

23. A memory device, in accordance with claim 22, wherein the column decoder circuit comprises plural column decoder circuits and at least one redundant column decoder circuit.

24. A memory device, in accordance with claim 23, further comprising a first group of data terminals and a second group of data terminals, wherein only the first group of data terminals is active, responsive to the first logic state of the test mode signal, and the first and second groups of data terminals are active, responsive to the second logic state of the test mode signal.

25. A memory device comprising:

a plurality data terminals;

plural sub-arrays of memory cells, each sub-array of memory cells arranged in addressable rows and columns of the memory cells and plural sub-arrays of the memory cells being arranged in sets, each set corresponding to a separate one of the data terminals;

a row decoder circuit, responsive to a row address, for selecting at least one row of memory cells in each of the sets of sub-arrays at once;

a column decoder circuit, responsive to a column address, for selecting a plurality of columns of the memory cells in each of the sets of sub-arrays at once; and a data comparison circuit for comparing a plurality of data bits from each set of sub-arrays, responsive to a test mode signal, the data comparison circuit producing a pass signal at each data terminal corresponding to a set of sub-arrays wherein the plurality of data bits are the same, the data comparison circuit producing a fail signal at each data terminal corresponding to a set of sub-arrays wherein the plurality of data bits are not the same, wherein the column decoder circuit is arranged for replacing the plurality of columns of the memory cells with an equal number of columns of redundant memory cells, responsive to the column address, in at least one of the sets of sub-arrays that produced the fail signal.

26. A memory device as in claim 25, wherein the row decoder circuit is arranged for replacing the plurality of rows of the memory cells with an equal number of rows of redundant memory cells, responsive to the row address, in at least one of the sets of sub-arrays that produced the fail signal.

27. A memory device as in claim 26, wherein each set of sub-arrays is a quadrant of sub-arrays.

28. A memory device as in claim 26, wherein the memory cells are dynamic random access memory cells.

29. A memory device as in claim 28, further comprising: a plurality of input/output buffer circuits, each input/output buffer circuit corresponding to one of the plurality of data terminals, each input/output buffer storing a test data bit, responsive to the test mode signal, wherein the data comparison circuit further compares the plurality of data bits from each set of sub-arrays with the test data bit stored in the respective each input/output buffer circuit.

30. A method of testing and repairing a semiconductor memory device comprising the steps of:

providing a plurality of semiconductor memory devices, each semiconductor memory device arranged in rows and columns of memory cells and having a plurality of data terminals;

providing memory tester having a plurality of data terminals;

coupling each of the plurality of data terminals of each semiconductor memory device to a separate one of the memory tester data terminals;

applying a test mode signal to the plurality of semiconductor memory devices, thereby initiating a test mode;

applying a write signal, an address signal and a plurality of data bits to each of the plurality of semiconductor memory devices at the same time, each of the plurality of semiconductor memory devices replicating the plurality of data bits in a number of memory cells greater than the plurality of data terminals of the each semiconductor memory device;

applying a read signal and the address signal to the plurality of semiconductor memory devices at the same time, each of the plurality of semiconductor memory devices comparing the data bits from the number of memory cells and producing a pass or fail signal at each of the respective data terminals;

storing the address and an identity of each data terminal corresponding to each fail signal in the memory tester;

determining whether a defective group of memory cells corresponding to the each stored fail signal is a defective row or column of memory cells;

repairing the defective group of memory cells in at least one of the plurality of semiconductor memory devices corresponding to the address and the identity of each data terminal by replacing every group of memory cells corresponding to the address and the identity of each data terminal with an equal number of redundant memory cells.

31. A method of testing and repairing a semiconductor memory device as in claim 30, further comprising the step of programming a decoder circuit in the at least one of the plurality of semiconductor memory devices for replacing the every group of memory cells corresponding to the address and an identity of each data terminal with an equal number of redundant memory cells.

32. A method of testing and repairing a semiconductor memory device as in claim 31, further comprising the step of programming the decoder circuit by blowing a plurality of fuses corresponding to the address of the defective group of memory cells.

33. A method of testing and repairing a semiconductor memory device as in claim 31, further comprising the step of comparing the replicated data bits from each of the plurality of data bits by a logical AND of each of a true and a complement of each of the replicated data bits, thereby producing a plurality of equivalent bits, each equivalent bit corresponding to one of the plurality of data terminals.

34. A method of testing and repairing a semiconductor memory device as in claim 33, further comprising the step of storing a plurality test data bits in a plurality of input/output buffer circuits, each input/output buffer circuit corresponding to one of the plurality of data terminals.

35. A method of testing and repairing a semiconductor memory device as in claim 34, further comprising the step of comparing each equivalent data bit to each respective test data bit.

* * * * *